United States Patent
Liu et al.

(10) Patent No.: US 11,910,632 B2
(45) Date of Patent: Feb. 20, 2024

(54) ORGANIC LIGHT-EMITTING DIODE DISPLAY DEVICE AND DISPLAY PANEL

(71) Applicant: Wuhan China Star Optoelectronics Semiconductor Display Technology Co., Ltd., Hubei (CN)

(72) Inventors: Shengfang Liu, Hubei (CN); Weiwei Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 688 days.

(21) Appl. No.: 17/055,619

(22) PCT Filed: Jun. 30, 2020

(86) PCT No.: PCT/CN2020/099334
§ 371 (c)(1),
(2) Date: Nov. 16, 2020

(87) PCT Pub. No.: WO2021/253490
PCT Pub. Date: Dec. 23, 2021

(65) Prior Publication Data
US 2022/0190297 A1    Jun. 16, 2022

(30) Foreign Application Priority Data
Jun. 17, 2020   (CN) .......................... 202010553362.9

(51) Int. Cl.
*H10K 50/19*    (2023.01)
*H10K 50/11*    (2023.01)
(Continued)

(52) U.S. Cl.
CPC ............. *H10K 50/19* (2023.02); *H10K 50/11* (2023.02); *H10K 2101/10* (2023.02); *H10K 2101/30* (2023.02); *H10K 2101/40* (2023.02)

(58) Field of Classification Search
CPC .... H10K 50/19; H10K 50/11; H10K 2101/10; H10K 2101/40; H10K 2101/30
See application file for complete search history.

(56) References Cited

U.S. PATENT DOCUMENTS

2007/0103066 A1* 5/2007 D'Andrade ............ H10K 59/32
                                                              313/506
2016/0155378 A1   6/2016 Hack et al.
(Continued)

FOREIGN PATENT DOCUMENTS

| CN | 102456840 | 5/2012 |
|---|---|---|
| CN | 106159101 | 11/2016 |

(Continued)

*Primary Examiner* — Mary Ellen Bowman

(57) ABSTRACT

An organic light-emitting diode display device is provided, including an anode layer, a cathode layer, a first light-emitting layer, and a second light-emitting layer disposed between the anode layer and the cathode layer, wherein the first light-emitting layer comprises a first light-emitting part, a second light-emitting part, and a third light-emitting part arranged side-by-side, the second light-emitting layer is configured to emit light of a same color as light emitted from the first light-emitting part, and the organic light-emitting diode display device further includes a charge generating layer disposed between the second light-emitting layer and the first light-emitting part.

20 Claims, 2 Drawing Sheets

(51) Int. Cl.
   *H10K 101/10*   (2023.01)
   *H10K 101/40*   (2023.01)
   *H10K 101/30*   (2023.01)

(56) References Cited

U.S. PATENT DOCUMENTS

| | | | |
|---|---|---|---|
| 2017/0033317 | A1 | 2/2017 | Kajimoto |
| 2018/0247982 | A1 | 8/2018 | Kim et al. |
| 2018/0254422 | A1 | 9/2018 | Wang |
| 2018/0375047 | A1 | 12/2018 | You et al. |
| 2019/0131556 | A1 | 5/2019 | Kim et al. |
| 2019/0189969 | A1 | 6/2019 | Youn et al. |
| 2019/0326542 | A1 | 10/2019 | Yang et al. |
| 2020/0227687 | A1* | 7/2020 | Ge .................. H10K 50/13 |

FOREIGN PATENT DOCUMENTS

| | | |
|---|---|---|
| CN | 106601919 | 4/2017 |
| CN | 107359256 | 11/2017 |
| CN | 108511484 | 9/2018 |
| CN | 109980110 | 7/2019 |
| CN | 209071334 | 7/2019 |
| CN | 209282205 | 8/2019 |
| CN | 110400822 | 11/2019 |
| CN | 110707226 | 1/2020 |
| CN | 110838550 | 2/2020 |
| CN | 111092163 | 5/2020 |
| WO | WO 2015/174508 | 11/2015 |

* cited by examiner

ORGANIC LIGHT-EMITTING DIODE DISPLAY DEVICE AND DISPLAY PANEL

RELATED APPLICATIONS

This application is a National Phase of PCT Patent Application No. PCT/CN2020/099334 having International filing date of Jun. 30, 2020, which claims the benefit of priority of Chinese Patent Application No. 202010553362.9 filed on Jun. 17, 2020. The contents of the above applications are all incorporated by reference as if fully set forth herein in their entirety.

FIELD AND BACKGROUND OF THE INVENTION

The present application relates to display field, and particularly relates to an organic light-emitting diode display device and a display panel.

Currently, organic light-emitting diode (OLED) display devices used in vehicles mainly have structures wherein red, green, and blue pixels are arranged side-by-side (RGB Side by Side, RGB-SBS) and tandem structures. OLED display devices using the RGB-SBS structure cannot achieve the current level of efficiency and lifespan of the devices using the Tandem structure. However, as it is necessary to double evaporation chambers in manufacturing of the tandem structure, this increases complexity and production cost of mass production, and is thus inconducive for mass production.

SUMMARY OF THE INVENTION

In view of this, the present application aims to provide an organic light-emitting diode display device and a display panel which can improve current efficiency and lifespan, and can be easily manufactured with a low cost.

An organic light-emitting diode display device, comprising an anode layer, a cathode layer, and a first light-emitting layer and a second light-emitting layer disposed between the anode layer and the cathode layer, wherein the first light-emitting layer comprises a first light-emitting part, a second light-emitting part, and a third light-emitting part arranged side-by-side, the second light-emitting layer is configured to emit light of a same color as light emitted from the first light-emitting part, and the organic light-emitting diode display device further comprises a charge generating layer disposed between the second light-emitting layer and the first light-emitting part.

In one embodiment, the charge generating layer comprises a first charge generating layer and a second charge generating layer disposed in a stack, the first charge generating layer is disposed close to a side of the anode layer, the second charge generating layer is disposed close to a side of the cathode layer, a material of the first charge generating layer comprises a P-type doped hole transport material, and a material of the second charge generating layer comprises an N-type doped electron transport material.

In one embodiment, an orthogonal projection of the first light-emitting part projected on the charge generating layer covers the charge generating layer.

In one embodiment, the second light-emitting layer is disposed between the cathode layer and the first light-emitting layer, and a highest occupied molecular orbital energy level of the second light-emitting layer is less than a highest occupied molecular orbital energy level of the first light-emitting part.

In one embodiment, a material of the second light-emitting layer comprises an electron-transmission type light-emitting material, and a material of the first light-emitting part comprises a hole-transmission type light-emitting material.

In one embodiment, the second light-emitting layer is disposed between the anode layer and the first light-emitting layer, and a highest occupied molecular orbital energy level of the second light-emitting layer is greater than a highest occupied molecular orbital energy level of the first light-emitting part.

In one embodiment, a material of the second light-emitting layer comprises a hole-transmission type light-emitting material, and a material of the first light-emitting part comprises an electron-transmission type light-emitting material.

In one embodiment, a first triplet excited state energy level of the second light-emitting layer is greater than a first triplet excited state energy level of the second light-emitting part and the first triplet excited state energy level of the third light-emitting part.

In one embodiment, the organic light-emitting diode display device comprises a hole injection layer, a hole transport layer disposed between the anode layer and the first light-emitting layer, and an electron transport layer disposed between the cathode layer and the first light-emitting layer.

A display panel is provided, comprising anyone of the above-mentioned organic light-emitting diode display devices.

Compared to prior art, by adding a second light-emitting layer and a charge generating layer on the RGB-SBS structure in the organic light-emitting diode display devices and display panels of the present application, light-emitting of the light-emitting layer can be selectively compensated through the stacked structure. In addition, by series connecting two light-emitting layers, number of light-emitting photons is increased, light-emitting efficiency is improved, and lifespan of OLED devices is improved under the same brightness. In addition, the second light-emitting layer is configured to be planar in the organic light-emitting diode display devices and display panels of the present application, once of a fine mask process can be omitted, resulting in cost down and yield improvement. Furthermore, aperture ratio of the organic light-emitting diode display devices and display panels can be improved.

BRIEF DESCRIPTION OF THE SEVERAL VIEWS OF THE DRAWINGS

In order to more clearly illustrate the technical solution of the present application, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DETAILED DESCRIPTION OF SPECIFIC EMBODIMENTS OF THE INVENTION

The present disclosure is further described in detail below with reference to the accompanying drawings and embodiments. Obviously, the following described embodiments are only part of the present disclosure but not all. A person having ordinary skill in the art may obtain other embodiments based on the embodiments provided in the present disclosure without making any creative effort, which all belong to the scope of the present disclosure.

Figure 1:
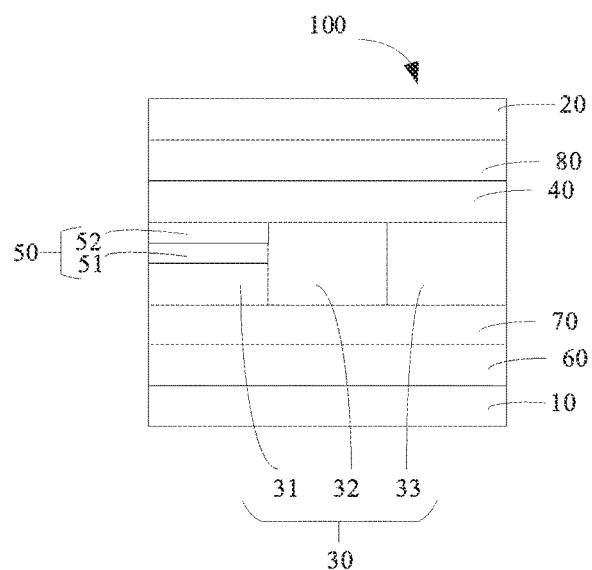
FIG. 1 is a structural schematic diagram of an organic light-emitting diode display device of a first embodiment of the present application.

Please refer to FIG. 1, an organic light-emitting diode (OLED) display device 100 is provided by a first embodiment of the present application. There are no restrictions as to what type the OLED display device 100 is. In other embodiments of the present application, the OLED display device 100 can be, for example, a quantum dot light emitting diode (QLED) display panel.

The OLED display device 100 includes an anode layer 10, a cathode layer 20, a first light-emitting layer 30, and a second light-emitting layer 40 disposed between the anode layer 10 and the cathode layer 20. The first light-emitting layer 30 comprises a first light-emitting part 31, a second light-emitting part 32, and a third light-emitting part 33 arranged side-by-side. The second light-emitting layer 40 is configured to emit light of a same color as light emitted from the first light-emitting part 31. The OLED display device 100 further comprises a charge generating layer 50 disposed between the second light-emitting layer 40 and the first light-emitting part 31.

According to light-emitting directions, the OLED display device 100 can be divided into top-emitting type and bottom-emitting type. According to the type of the OLED display device 100, the anode 10 can be a metal electrode layer or a transparent electrode layer. A material of the metal electrode layer can be selected from metal materials having high work function. A material of the transparent electrode layer can be selected from metal oxides, such as indium tin oxide, etc.

The cathode 20 also can be the metal electrode layer or the transparent electrode layer or a semitransparent electrode layer. A material of the metal electrode layer can be selected from metal materials having low work function, such as lithium, calcium, magnesium, beryllium, aluminum, gold, silver, or alloys of two or more metals. A material of the transparent electrode layer and the semitransparent electrode layer can be selected from metal oxides, such as indium tin oxide and so on.

In this embodiment, the first light-emitting part 31 is configured to emit light of a first color, the first light-emitting part 32 is configured to emit light of a second color, and the third light-emitting part 33 is configured to emit light of a third color. The first light-emitting part 31, the second light-emitting part 32 and the third light-emitting part 33 each correspond to a red light-emitting layer, a blue light-emitting layer, and a green light-emitting layer. For example, in this embodiment, the first color can be any one of red, blue, or green. It can be understood that in other embodiments of the present application, the first light-emitting layer 30 can include four color light-emitting layers, a fourth color being yellow or white. The first color can be any one of red, blue, green, and yellow; or any one of red, blue, green, and white.

A material of the light-emitting layer 30 includes organic electroluminescent materials. The organic electroluminescent materials include high or low molecular weight electroluminescent materials, fluorescent, and phosphorescent compounds. For example, the green light-emitting layer can be selected as Alq, and the blue light-emitting layer can be selected from Balq, DPVBi and so on.

The second light-emitting layer 40 includes materials which can be made into a light-emitting layer. In this embodiment, the second light-emitting layer 40 is disposed between the cathode layer 20 and the first light-emitting layer 30. A highest occupied molecular orbital (HOMO) energy level of the second light-emitting layer 40 is less than a HOMO energy level of the first light-emitting part 31. A material of the second light-emitting layer 40 includes an electron-transmission type light-emitting material, and a material of the first light-emitting part 31 includes a hole-transmission type light-emitting material. In the present application, the so-called "hole-transmission type material" refers to materials of which hole mobility is greater than electron mobility, or hole injection capability is greater than electron injection capability. The so-called "electron-transmission type material" refers to materials of which electron mobility is greater than hole mobility, or electron injection capability is greater than hole injection capability. That is to say, hole transport is fast and electron transport is slow in the hole-transmission type materials; and hole transport is slow and electron transport is fast in the electron-transmission type materials. CBP can be illustrated as the hole-transmission type material. BAlq can be illustrated as the electron-transmission type material. In this embodiment, the second light-emitting layer 40 is configured to be planar, that is to say, an orthogonal projection of the second light-emitting layer 40 projected on the first light-emitting layer 30 covers the first light-emitting layer 30. The planar second light-emitting layer 40 is easy to manufacture, and compared to the RBG light-emitting layer arranged side-by-side, one fine mask utilization can be omitted.

A first triplet excited state energy level of the second light-emitting layer 40 is greater than a first triplet excited state energy level of the second light-emitting part 32 and a first triplet excited state energy level of the third light-emitting part 33. Therefore, light emission of the second light-emitting part 32 and the third light-emitting part 33 can be protected from effects of the second light-emitting layer 40.

Furthermore, the OLED display device 100 can further include a hole injection layer 50, a hole transport layer 60 disposed between the anode layer 10 and the first light-emitting layer 30, and an electron transport layer 70 disposed between the cathode layer 20 and the first light-emitting layer 30.

The charge generating layer 50 is only disposed corresponding to the first light-emitting part 31. That is to say, an orthogonal projection of the first light-emitting part 31 projected on the charge generating layer 50 covers the charge generating layer 50. An area of the charge generating layer 50 is less than or equal to the first light-emitting part 31. No charge generating layer 50 is disposed between the second light-emitting part 32 and the second light-emitting layer 40, and no charge generating layer 50 is disposed between the third light-emitting part 33 and the second light-emitting layer 40, so that color mixing between light emitted from the second light-emitting layer 40 and the second light-emitting part 32 and third light-emitting part 33 can be prevented. The charge generating layer 50 includes a first charge generating layer 51 and a second charge generating layer 52 disposed in a stack. The first charge generating layer 51 is located on a side close to the anode layer 10. The second charge generating layer 52 is located on a side close to the cathode layer 20. A material of the first charge generating layer 51 includes a P-type doped hole transport material, and a material of the second charge generating layer 52 includes an N-type doped electron transport material, for example a Li doped electron transport material, so as to benefit the charge transport from the first light-emitting part 31 to the second light-emitting part 40.

Figure 2:
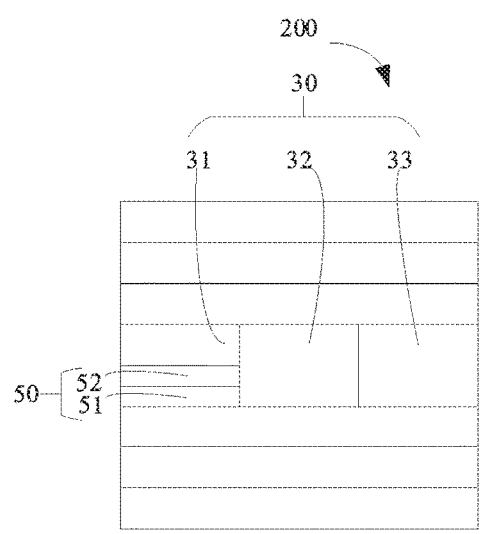
FIG. 2 is a structural schematic diagram of the organic light-emitting diode display device of a second embodiment of the present application.

Please refer to FIG. 2, an OLED display device 200 of a second embodiment of the present application is almost the same as the OLED display device 100 of the first embodiment, they differ in that the second light-emitting layer 40 is disposed between the anode layer 10 and the first light-emitting layer 30. A HOMO energy level of the second light-emitting layer 40 is greater than a HOMO energy level of the first light-emitting part 31. The material of the second light-emitting layer 40 includes the hole-transmission type light-emitting material, and the material of the first light-emitting part 31 includes the electron-transmission type light-emitting material.

The charge generating layer 50 includes a first charge generating layer 51 and a second charge generating layer 52 disposed in a stack. The first charge generating layer 51 is located on a side close to the anode layer 10. The second charge generating layer 52 is located on a side close to the cathode layer 20. A material of the first charge generating layer 51 includes the P-type doped hole transport material, and a material of the second charge generating layer 52 includes the N-type doped electron transport material, for example the Li doped electron transport material, so as to benefit the charge transport from the second light-emitting layer 40 to the first light-emitting part 31.

Figure 3:
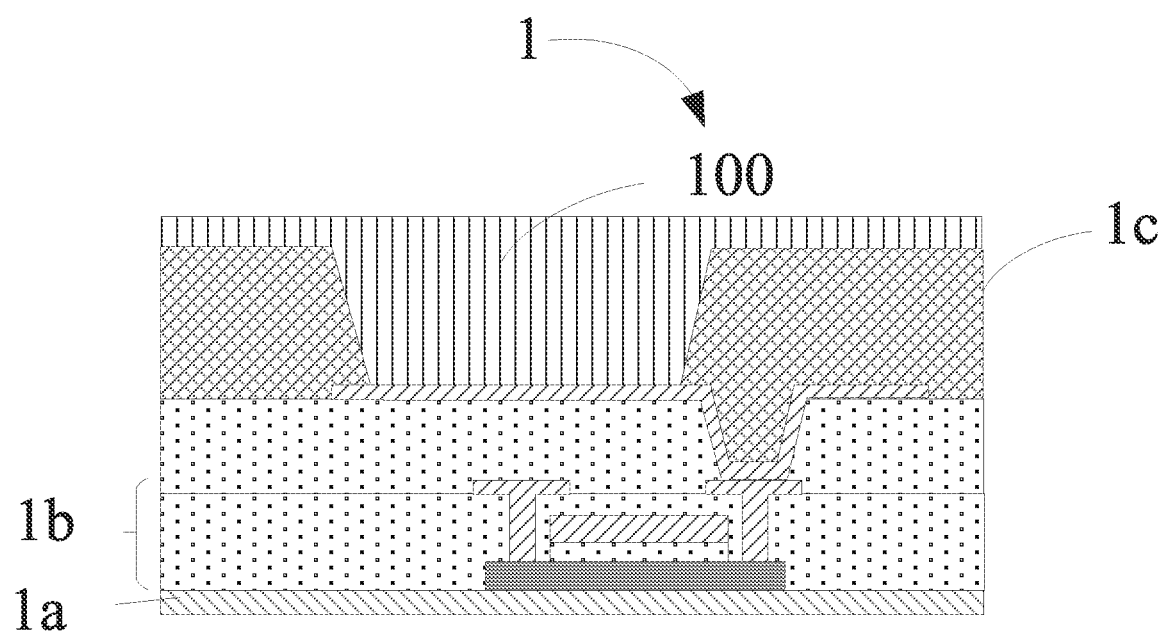
FIG. 3 is a structural schematic diagram of a display panel of a third embodiment of the present disclosure.

Please refer to FIG. 3, a display panel 1 is provided by the third embodiment of this disclosure. The display panel 1 can be used in mobile phones, tablet computers, televisions, billboards, ATMs, car monitors, etc. In this embodiment, the display panel 1 is a car monitor. The display panel 1 comprises a substrate 1a, a driver circuit layer 1b disposed on the substrate 1a, a pixel definition layer 1c and a plurality of organic light-emitting devices 100 disposed on the driver circuit layer 1. The OLED display device 100 is any one of the OLED display devices according to the first and second embodiments.

Compared to prior art, by adding a second light-emitting layer and a charge generating layer on the RGB-SBS structure in the OLED display devices and display panels of the present application, light emission of the light-emitting layer can be selectively compensated through the stacked structure. In addition, by series connecting two light-emitting layers, a number of light-emitting photons is increased, light-emitting efficiency is improved, and a lifespan of the OLED devices is improved under the same brightness. In addition, the second light-emitting layer is configured to be planar in the OLED display devices and display panels of the present application, omitting one fine mask process, resulting in lowering costs while improving yields. Furthermore, an aperture ratio of the OLED display devices and display panels can be improved.

The above description provides a detailed introduction to the application. In this disclosure, specific examples are applied to explain principle and embodiments of the application. The description of the above embodiments is only used to help understand the application. At the same time, for those skilled in the art, according to the thought of the present application, there will be changes in the specific embodiments and application scope. In conclusion, the content of the specification should not be understood as the limitation of the application.

What is claimed is:

1. An organic light-emitting diode display device, comprising an anode layer, a cathode layer, and a first light-emitting layer and a second light-emitting layer disposed between the anode layer and the cathode layer, wherein the first light-emitting layer comprises a first light-emitting part, a second light-emitting part, and a third light-emitting part arranged side-by-side, the second light-emitting layer is configured to emit light of a same color as light emitted from the first light-emitting part, and the organic light-emitting diode display device further comprises a charge generating layer disposed between the second light-emitting layer and the first light-emitting part, and no charge generating layer is disposed between the second light-emitting layer and the second light-emitting part as well as between the second light-emitting layer and the third light-emitting part.

2. The organic light-emitting diode display device of claim 1, wherein the charge generating layer comprises a first charge generating layer and a second charge generating layer disposed in a stack, the first charge generating layer is disposed close to a side of the anode layer, the second charge generating layer is disposed close to a side of the cathode layer, a material of the first charge generating layer comprises a P-type doped hole transport material, and a material of the second charge generating layer comprises an N-type doped electron transport material.

3. The organic light-emitting diode display device of claim 1, wherein an orthogonal projection of the first light-emitting part projected on the charge generating layer covers the charge generating layer.

4. The organic light-emitting diode display device of claim 1, wherein the second light-emitting layer is disposed between the cathode layer and the first light-emitting layer, and a highest occupied molecular orbital energy level of the second light-emitting layer is less than a highest occupied molecular orbital energy level of the first light-emitting part.

5. The organic light-emitting diode display device of claim 4, wherein a material of the second light-emitting layer comprises an electron-transmission type light-emitting material, and a material of the first light-emitting part comprises a hole-transmission type light-emitting material.

6. The organic light-emitting diode display device of claim 1, wherein the second light-emitting layer is disposed between the anode layer and the first light-emitting layer, and a highest occupied molecular orbital energy level of the second light-emitting layer is greater than a highest occupied molecular orbital energy level of the first light-emitting part.

7. The organic light-emitting diode display device of claim 6, wherein a material of the second light-emitting layer comprises a hole-transmission type light-emitting material, and a material of the first light-emitting part comprises an electron-transmission type light-emitting material.

8. The organic light-emitting diode display device of claim 1, wherein a first triplet excited state energy level of the second light-emitting layer is greater than a first triplet excited state energy level of the second light-emitting part and a first triplet excited state energy level of the third light-emitting part.

9. The organic light-emitting diode display device of claim 1, wherein the organic light-emitting diode display device comprises a hole injection layer and a hole transport layer disposed between the anode layer and the first light-emitting layer, and an electron transport layer disposed between the cathode layer and the first light-emitting layer.

10. A display panel, comprising an organic light-emitting diode display device, comprising an anode layer, a cathode layer, and a first light-emitting layer and a second light-emitting layer disposed between the anode layer and the cathode layer, wherein the first light-emitting layer comprises a first light-emitting part, a second light-emitting part, and a third light-emitting part arranged side-by-side, the second light-emitting layer is configured to emit light of a same color as light emitted from the first light-emitting part, and the organic light-emitting diode display device further comprises a charge generating layer disposed between the second light-emitting layer and the first light-emitting part, and no charge generating layer is disposed between the second light-emitting layer and the second light-emitting part as well as between the second light-emitting layer and the third light-emitting part.

11. The display panel of claim 10, wherein the charge generating layer comprises a first charge generating layer and a second charge generating layer disposed in a stack, the first charge generating layer is disposed close to a side of the anode layer, the second charge generating layer is disposed close to a side of the cathode layer, a material of the first charge generating layer comprises a P-type doped hole transport material, and a material of the second charge generating layer comprises an N-type doped electron transport material.

12. The display panel of claim 10, wherein an orthogonal projection of the first light-emitting part projected on the charge generating layer covers the charge generating layer.

13. The display panel of claim 10, wherein the second light-emitting layer is disposed between the cathode layer and the first light-emitting layer, and a highest occupied molecular orbital energy level of the second light-emitting layer is less than a highest occupied molecular orbital energy level of the first light-emitting part.

14. The display panel of claim 13, wherein a material of the second light-emitting layer comprises an electron-biased type light-emitting material, and a material of the first light-emitting part comprises a hole-transmission type light-emitting material.

15. The display panel of claim 10, wherein the second light-emitting layer is disposed between the anode layer and the first light-emitting layer, and a highest occupied molecular orbital energy level of the second light-emitting layer is greater than a highest occupied molecular orbital energy level of the first light-emitting part.

16. The display panel of claim 15, wherein a material of the second light-emitting layer comprises a hole-transmission type light-emitting material, and a material of the first light-emitting part comprises an electron-transmission type light-emitting material.

17. The display panel of claim 10, wherein a first triplet excited state energy level of the second light-emitting layer is greater than a first triplet excited state energy level of the second light-emitting part and the first triplet excited state energy level of the third light-emitting part.

18. The display panel of claim 10, wherein the organic light-emitting display device comprises a hole injection layer, a hole transport layer disposed between the anode layer and the first light-emitting layer, and an electron transport layer disposed between the cathode layer and the first light-emitting layer.

19. The organic light-emitting diode display device of claim 1, wherein the second light-emitting layer is configured to be planar.

20. The display panel of claim 10, wherein the second light-emitting layer is configured to be planar.

* * * * *